United States Patent
Li et al.

(10) Patent No.: US 9,299,796 B2
(45) Date of Patent: Mar. 29, 2016

(54) METHOD FOR MANUFACTURING GATE STACK STRUCTURE IN INSTA-METAL-OXIDE-SEMICONDUCTOR FIELD-EFFECT-TRANSISTOR

(71) Applicant: National Central University, Taoyuan (TW)

(72) Inventors: Pei-Wen Li, Taoyuan (TW); Wei-Ting Lai, New Taipei (TW); Ting-Chia Hsu, Taoyuan (TW); Kuo-Ching Yang, Nantou County (TW); Po-Hsiang Liao, New Taipei (TW); Thomas George, La Canada, CA (US)

(73) Assignee: NATIONAL CENTRAL UNIVERSITY, Taoyuan (TW)

( * ) Notice: Subject to any disclaimer, the term of this patent is extended or adjusted under 35 U.S.C. 154(b) by 0 days.

(21) Appl. No.: 14/619,594

(22) Filed: Feb. 11, 2015

(65) Prior Publication Data
US 2016/0013283 A1      Jan. 14, 2016

(30) Foreign Application Priority Data

Jul. 8, 2014   (TW) .............................. 103123414 A

(51) Int. Cl.
| | |
|---|---|
| H01L 29/423 | (2006.01) |
| H01L 29/66 | (2006.01) |
| H01L 21/02 | (2006.01) |
| H01L 21/28 | (2006.01) |
| H01L 21/3065 | (2006.01) |

(52) U.S. Cl.
CPC ...... *H01L 29/42376* (2013.01); *H01L 21/0217* (2013.01); *H01L 21/02164* (2013.01); *H01L 21/02236* (2013.01); *H01L 21/02532* (2013.01); *H01L 21/28114* (2013.01); *H01L 21/3065* (2013.01); *H01L 29/4236* (2013.01); *H01L 29/66613* (2013.01); *H01L 21/02255* (2013.01)

(58) Field of Classification Search
CPC .................. H01L 29/42376; H01L 21/02164; H01L 21/02532; H01L 29/66613
USPC ........................................................ 438/270
See application file for complete search history.

(56) References Cited

U.S. PATENT DOCUMENTS

| | | | |
|---|---|---|---|
| 7,078,300 B2 | 7/2006 | Gousev et al. | |
| 9,129,827 B2 * | 9/2015 | Cappellani | .............. H01L 21/76 |
| 2005/0070053 A1 * | 3/2005 | Sadaka | ............. H01L 21/26506 438/151 |

(Continued)

*Primary Examiner* — Amar Movva
*Assistant Examiner* — Omar Mojaddedi
(74) *Attorney, Agent, or Firm* — Muncy, Geissler, Olds & Lowe, P.C.

(57) ABSTRACT

A method for manufacturing a metal-oxide-semiconductor (MOS) gate stack structure in an insta-MOS field-effect-transistor (i-MOSFET) includes the following steps of: forming a silicon nitride layer over a silicon substrate; forming a nanopillar structure including a silicon-germanium alloy layer in contact with the silicon nitride layer; and performing a thermal oxidation process on the nanopillar structure to cause germanium atoms in the silicon-germanium alloy layer to penetrate the underneath silicon nitride layer to form a silicon-germanium shell layer in contact with the silicon substrate and a germanium nanosphere located over the silicon germanium shell layer, and to form a separating layer between the silicon-germanium shell layer and the germanium nanosphere by oxidizing silicon atoms from the silicon nitride layer or the silicon substrate, thereby forming a germanium/silicon dioxide/silicon-germanium i-MOS gate stack structure capable of solving interfacial issues between silicon and germanium and between germanium and the gate dielectric.

12 Claims, 13 Drawing Sheets

(56) References Cited

U.S. PATENT DOCUMENTS

| | | | |
|---|---|---|---|
| 2008/0237684 A1* | 10/2008 | Specht | H01L 21/28282 257/316 |
| 2010/0164102 A1* | 7/2010 | Rachmady | B82Y 10/00 257/741 |
| 2011/0147697 A1* | 6/2011 | Shah | B82Y 10/00 257/9 |
| 2012/0235233 A1* | 9/2012 | Nowak | H01L 29/66795 257/347 |

* cited by examiner

METHOD FOR MANUFACTURING GATE STACK STRUCTURE IN INSTA-METAL-OXIDE-SEMICONDUCTOR FIELD-EFFECT-TRANSISTOR

FIELD OF THE INVENTION

The present invention relates to a semiconductor element having a silicon-germanium interface, and particularly to a unique method for manufacturing a gate stack structure of a metal-oxide-semiconductor field-effect transistor (MOSFET), named as insta-MOSFET (i-MOSFET).

BACKGROUND OF THE INVENTION

With continuous development of semiconductor manufacturing technologies, the density of devices per unit area and computation speeds of elements within an integrated circuit also grow exponentially. According to Moore's Law estimates, the number of transistors in a central processing unit (CPU) of a computer has currently exceeded seven billion. In order to achieve such high densities, sizes of fundamental elements within an integrated circuit continue to reduce significantly. For example, in a metal-oxide-semiconductor field-effect transistor (MOSFET), a decisive factor influencing the size reduction of individual elements is the gate structure definition.

In U.S. Pat. No. 7,078,300, a method for manufacturing a thin germanium oxynitride gate dielectric layer on a Ge-based material is disclosed. The method involves two manufacturing steps. In the first step, nitrogen is incorporated into a surface layer of the Ge-based material. In the second step, the nitrogen-incorporated Ge-based layer is oxidized. In the method, the nitrogen-incorporated Ge-based material is exposed in an oxygen-containing environment to yield excellent thickness control of high quality gate dielectrics for Ge-based field effect devices, such as MOS transistors.

To keep current manufacturing processes of germanium MOS structures cost-effective, a germanium film is usually grown on a silicon substrate, and a gate dielectric layer is formed on the germanium film, followed by forming a gate electrode layer on the gate dielectric layer to complete the manufacturing of a gate structure. A patterning step is then performed to produce the required channel length.

However, the above method suffers thorny interface issues that are described below.

First, the difference between lattice constants of germanium and silicon is about 4.2%, meaning that a substantial compressive strain is induced when a germanium layer or a silicon-germanium alloy layer is grown on the silicon substrate. As the thickness of the germanium layer or the silicon-germanium layer exceeds a "critical" thickness, stress relaxation takes place by the generation of interfacial defects known as misfit dislocations. Further, in order to minimize the impact of these defects caused by stress relaxation on the device characteristics and performance, not only is an additional germanium buffer layer to be grown, but also a high-temperature annealing process is often required.

Second, as compared to the stable interface that exists between silicon and silicon dioxide, the oxide of germanium, $GeO_2$, is quite soluble in water and thermally unstable when exposed to high temperature (as in the annealing process). Thus, additional interfacial defects are likely introduced during the subsequent cleaning and high-temperature processes, leading to a rough interface with undesirable interfacial properties.

Therefore, there is a great need for a solution that effectively overcomes the above critical issues.

SUMMARY OF THE INVENTION

The primary objective of the present invention is to solve issues experienced by a conventional germanium metal-oxide-semiconductor field-effect transistor (MOSFET) gate stack structure. In the manufacturing process for the conventional germanium MOSFET gate stack structure, interfaces between germanium and silicon as well as between germanium and a gate dielectric are susceptible to defect formation, resulting in the use of complicated manufacturing processes with stringent limitations imposed on the thermal budget in order to reduce the density of defects.

A method for manufacturing an MOS gate stack structure for an insta-MOSFET (i-MOSFET) device that overcomes the above problems includes the following steps.

In step 1, a silicon nitride layer is formed on a silicon substrate.

In step 2, a nanopillar structure is formed on the silicon nitride layer. The nanopillar structure includes a silicon-germanium alloy layer in contact with the silicon nitride layer.

In step 3, a thermal oxidation process is performed on the nanopillar structure to cause germanium atoms in the silicon-germanium alloy layer to penetrate the silicon nitride layer and ultimately form a silicon-germanium shell layer when they come in contact with the silicon substrate via the formation of a germanium nanosphere located over the silicon-germanium shell layer. Further, a separating layer between the silicon-germanium shell layer and the germanium nanosphere is formed by oxidizing silicon atoms released from the silicon nitride layer or the silicon substrate, thereby forming the overall germanium/silicon dioxide/silicon-germanium i-MOS gate stack structure in a single fabrication step.

As such, in the present invention, the silicon-germanium alloy layer will be in contact with the silicon nitride layer over the Si substrate prior to the oxidation, and the germanium/silicon dioxide/silicon-germanium i-MOS gate stack structure is formed in a one-step thermal oxidation process. With the catalytic assistance provided by germanium, the amorphous silicon dioxide separation layer is formed by oxidizing the silicon atoms released from the silicon nitride layer or the silicon substrate. Thus, the interface between the germanium and silicon dioxide is quite stable, while simultaneously preventing interfacial issues such as miscibility and strain relaxation that are caused by the affinity and lattice mismatch between silicon and germanium. Further, the present invention also can eliminate the limitation on subsequent high-temperature processes while maintaining simple manufacturing steps to realize the Ge MOSFET gate stack structure.

The foregoing, as well as additional objects, features and advantages of the invention will become more readily apparent from the following detailed description, which proceeds with reference to the accompanying drawings.

DETAILED DESCRIPTION OF THE PREFERRED EMBODIMENTS

Details and technical content of the present invention are described with reference to the accompanying drawings below.

Figure 1:
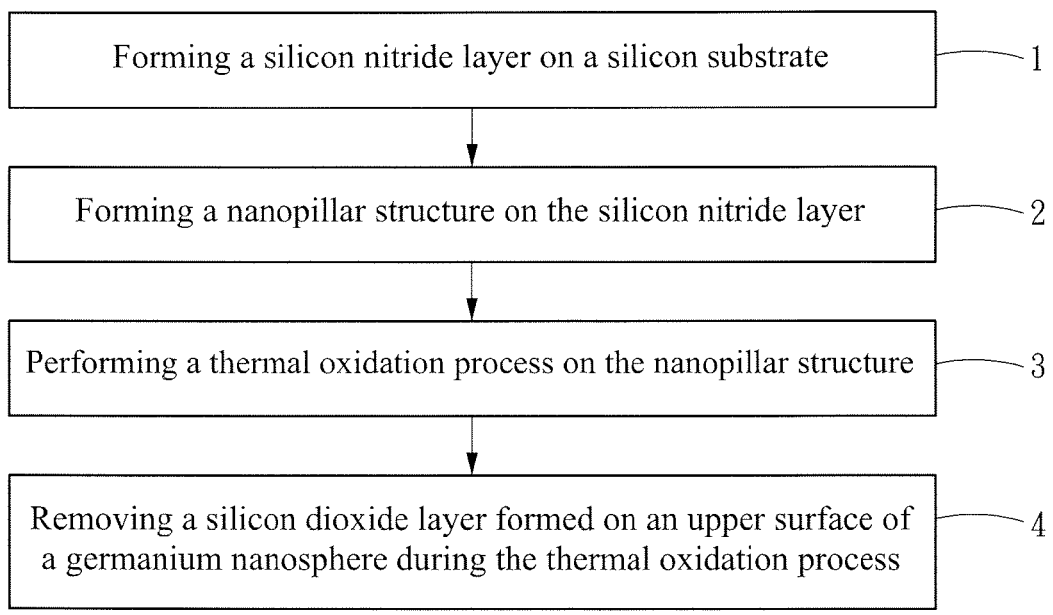
FIG. 1 is a flowchart of steps of a method according to a first embodiment of the present invention.

FIG. 1 is a flowchart illustrating steps of a method according to a first embodiment of the present invention. FIGS. 2A to 2G are schematic diagrams of a manufacturing process according to the first embodiment of the present invention. Referring to FIG. 1 and FIGS. 2A to 2G, a method for manufacturing a MOS gate stack structure of the present invention includes the following steps.

Figure 2A:
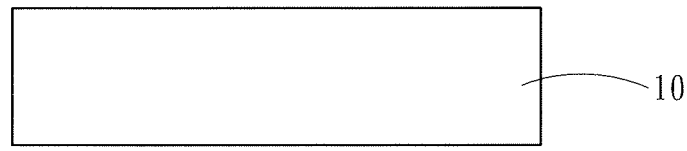
FIGS. 2A to 2G are schematic diagrams of a manufacturing process according to the first embodiment of the present invention.
Figure 2B:
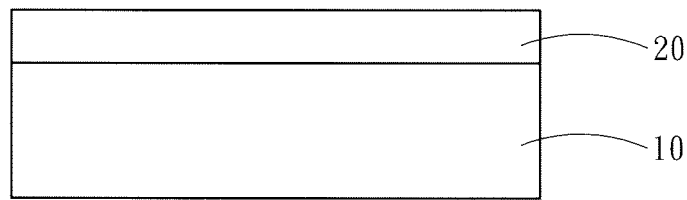

In step 1, a silicon nitride layer 20 is formed over a silicon substrate 10. In the embodiment, as shown in FIG. 2A and FIG. 2B, the silicon substrate 10 is first provided. The silicon substrate 10 is cleaned by an RCA clean, and the silicon nitride layer 20 is then deposited on the silicon substrate 10 by chemical vapor deposition (CVD) at a temperature of 780° C. In this embodiment, for example, the thickness of the silicon nitride layer 20 is about 30 nm. In other embodiments, the thickness of the silicon nitride layer 20 may be between 5 nm to 150 nm.

Figure 2C:
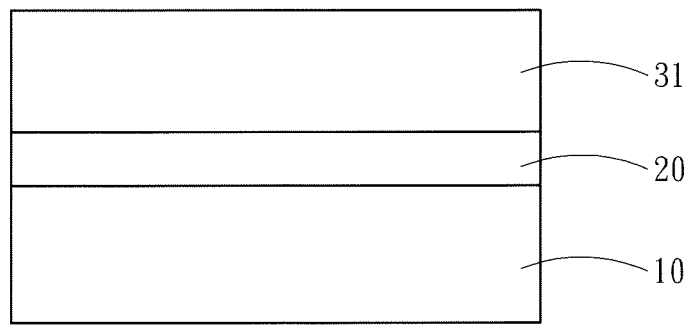
Figure 2D:
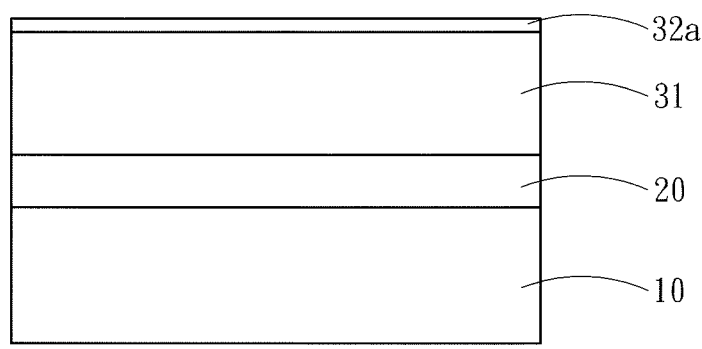
Figure 2E:
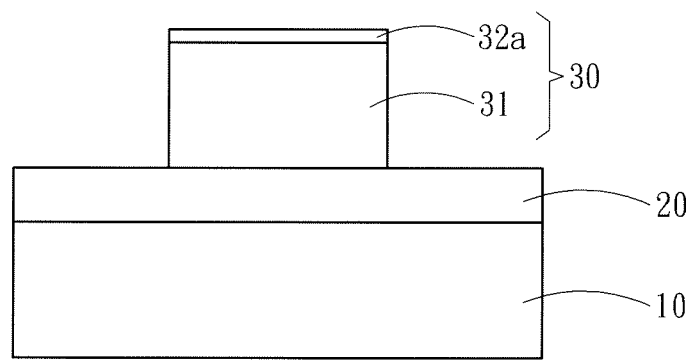

In step 2, a nanopillar structure 30 is formed on the silicon nitride layer 20. The nanopillar structure 30 includes a silicon-germanium alloy layer 31 in contact with the silicon nitride layer 20. In step 2, as shown in FIG. 2C, in continuation of the previous step, the silicon-germanium alloy layer 31 is deposited on the silicon nitride layer 20 by CVD at a temperature lower than 550° C. The thickness of the silicon-germanium alloy layer 31 may be between 5 nm to 200 nm. In the embodiment, the silicon-germanium alloy layer 31 may be polycrystalline silicon-germanium (poly-$Si_{1-x}Ge_x$), where the Mole fraction of germanium (x) in the silicon-germanium alloy layer is between 0.01 to 0.8, preferably 0.15. In the embodiment, as shown in FIG. 2D, a silicon dioxide layer 32a may further be grown on the silicon-germanium alloy layer 31. The silicon dioxide layer 32a has a thickness of about 5 nm, and acts as a blocking layer in step 3 to prevent the evaporation of germanium atoms during a subsequent thermal oxidation process. As shown in FIG. 2E, a electron beam lithographic or photolithographic technique and plasma dry etching are performed on the silicon-germanium alloy layer 31 and the silicon dioxide layer 32a to define the nanopillar structure 30 having a size of, for example, 100 nm times 100 nm, but this is not a limitation of the present invention.

In step 3, a thermal oxidation process is performed on the nanopillar structure 30 to cause germanium atoms within the silicon-germanium alloy layer 31 to penetrate underneath the silicon nitride layer 20 and form a silicon-germanium shell layer 311 in contact with the silicon substrate 10 and also to form a germanium nanosphere 312 located over the silicon-germanium shell layer 311. Further, a separating layer 313 between the silicon-germanium shell layer 311 and the germanium nanosphere 312 is formed by oxidizing released silicon atoms from the silicon nitride layer 20 and/or the silicon substrate 10, thereby forming a germanium/silicon dioxide/silicon-germanium MOS gate stack structure, named as insta-MOS (i-MOS).

Figure 2F:
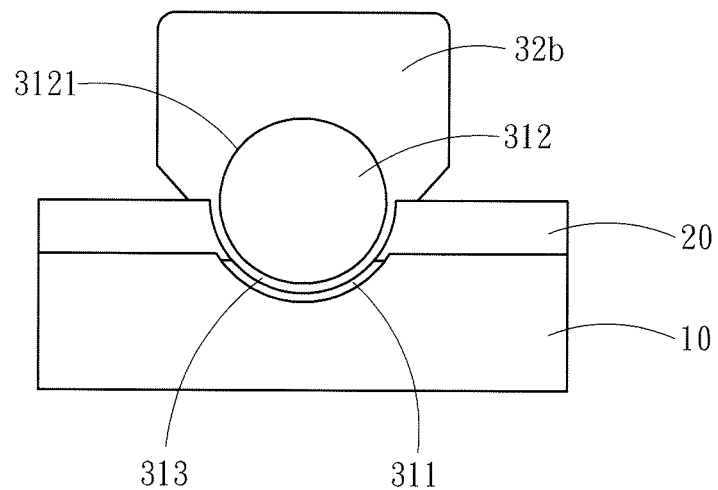

Referring to FIG. 2F, further description is given as below. The silicon substrate 10 with the silicon nitride layer 20 and the nanopillar structure 30 are placed into a thermal oxidation furnace tube. The thermal oxidation furnace tube may selectively provide an oxygen-containing environment such as a wet oxygen environment or a dry oxygen environment, with an adjustable oxidation temperature between 200° C. to 1000° C. First, the thermal oxidation furnace is set to provide the wet oxygen environment with a temperature of about 900° C. to fully oxidize the silicon-germanium alloy layer 31 to form the germanium nanosphere 312. Next, the thermal oxidation furnace tube is set to provide an oxygen-containing environment with a temperature of about 800° C. to 900° C. to cause the germanium nanosphere 312 to further burrow into the silicon nitride layer 20 underneath, ultimately reaching the surface of the silicon substrate 10. At this point, the silicon nitride layer 20 or a part of the silicon substrate 10 are decomposed, releasing silicon atoms which are then oxidized to form the separating layer 313 located between the germanium nanosphere 312 and the silicon substrate 10. Further, a portion of the germanium atoms from the germanium nanosphere 312 diffuse through the separating layer 313 and come in contact with the silicon substrate 10, forming the silicon-germanium shell layer and thereby realizing the germanium/silicon dioxide/silicon-germanium i-MOS gate stack structure.

According to the first embodiment of the present invention, the method may further include step 4 below.

Figure 2G:
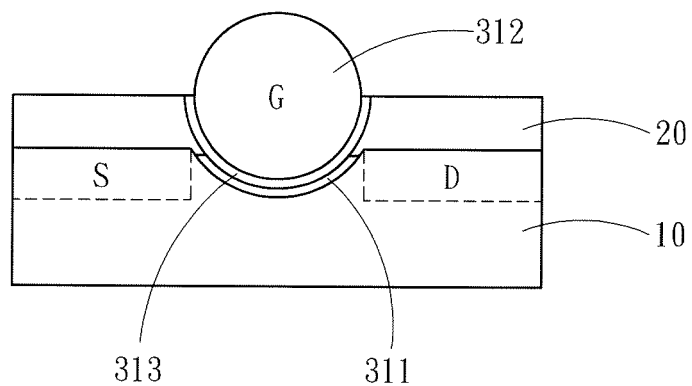

In step 4, a silicon dioxide layer 32b formed at an upper surface 3121 of the germanium nanosphere 312 during the thermal oxidation process is removed. It should be noted that, in the nanopillar structure 30 according to the embodiment, thermal oxidation converts the silicon atoms in the silicon-germanium alloy layer 31 to the silicon dioxide layer 32b over surface 3121, and concurrently covers the germanium nanosphere 312 with the separating layer 313. The MOS gate stack structure is processed by plasma dry etching to remove the silicon dioxide layer 32b to expose the upper surface 3121 of the germanium nanosphere 312. The germanium nanosphere 312 is subsequently metalized to form a germanium-metal alloy to define a gate. Next, ion implantation is performed in the silicon substrate 10 at two sides of the silicon-germanium shell layer 311 to define a source S and a drain D, respectively, thereby forming a MOS core element structure, as shown in FIG. 2G.

Figure 3:
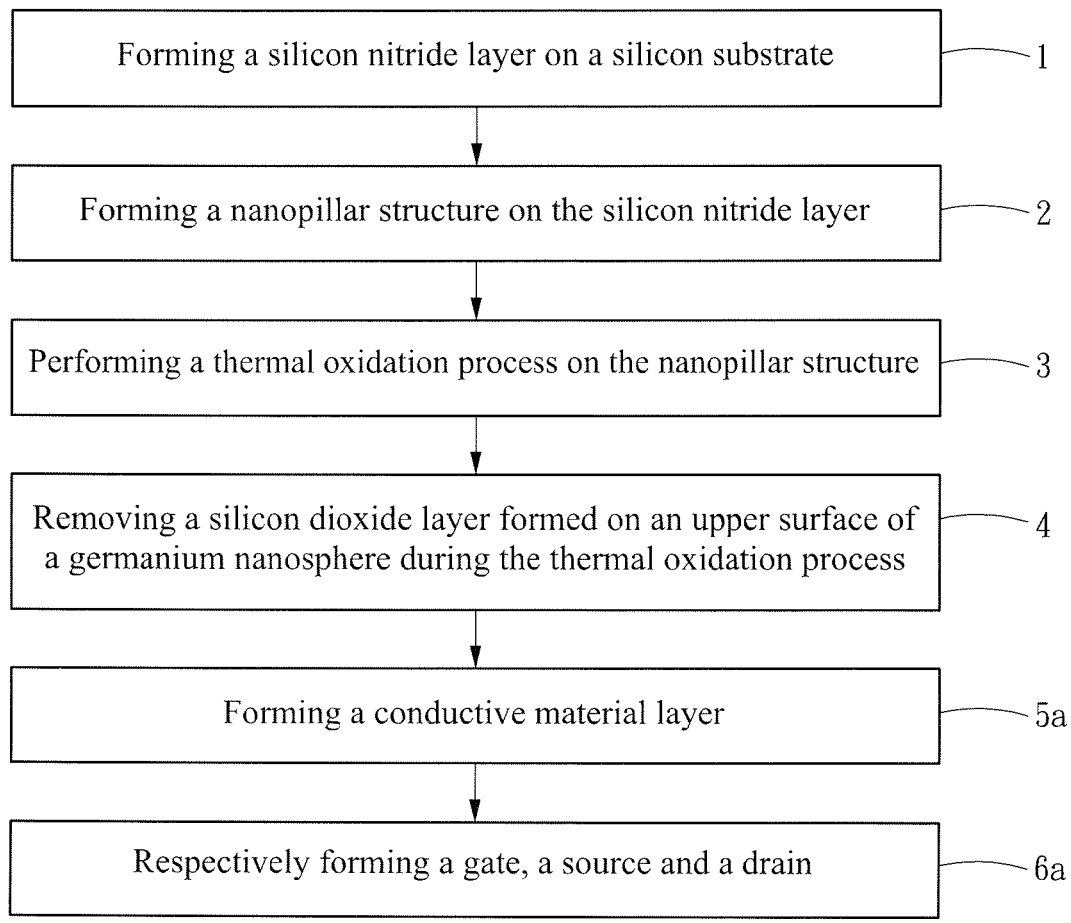
FIG. 3 is a flowchart of steps of a method according to a second embodiment of the present invention.
Figure 4A:
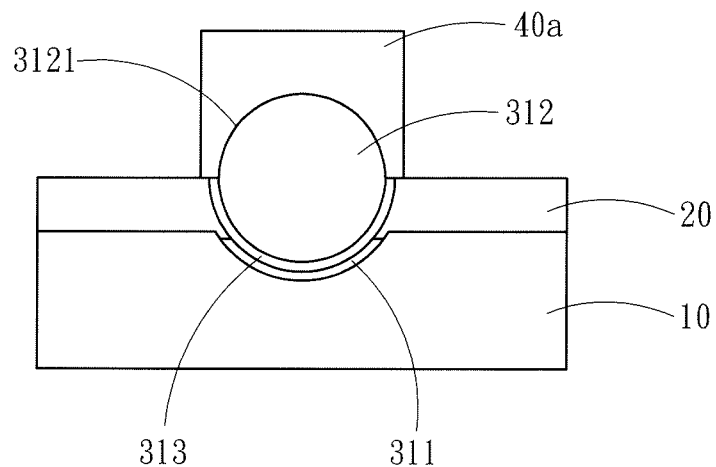
FIG. 4A and FIG. 4B are schematic diagrams of a manufacturing process of a MOS core element structure according to the second embodiment of the present invention.
Figure 4B:
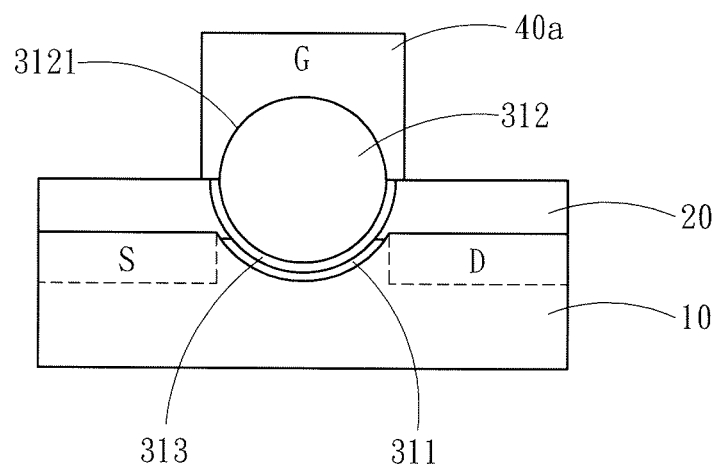

FIG. 3 shows a flowchart of steps of a method according to a second embodiment of the present invention. FIG. 4A and FIG. 4B show schematic diagrams of a manufacturing process of a MOS core element structure according to the second embodiment of the present invention. Referring to FIG. 3, FIG. 4A and FIG. 4B, compared to the first embodiment, the second embodiment further includes step 5a and step 6a after step 4.

In step 5a, a conductive material layer 40a is formed at the upper surface 3121. As shown in FIG. 4A, after the silicon dioxide layer 32b of the upper surface 3121 is removed, the MOS gate stack structure is treated by an oxide layer removing solution to remove a native oxide layer potentially formed at the upper surface 3121. Immediately, the conductive material layer 40a having a thickness of about 200 nm is formed at the upper surface 3121 by sequential deposition, lithography and etching processes. For example, the material of the conductive material layer 40a may be polycrystalline silicon, a silicon-metal alloy, or a metal material such as aluminum or aluminum-silicon-copper alloy.

In step 6a, a gate G a source S and a drain D are formed at the conductive material layer 40a and in the silicon substrate 10 at two sides of the silicon germanium shell layer 311, respectively. As shown in FIG. 4B, the gate G, the source S and the drain D are defined by ion implantation at the conductive material layer 40a and in the silicon substrate 10 at two sides of the silicon-germanium shell layer 311, respectively. With general silicon manufacturing processes including thermal annealing, depositing a protection layer, defining contact windows and metal regions, and sintering, a MOS core element structure is realized formed by the i-MOS gate stack structure.

Figure 5:
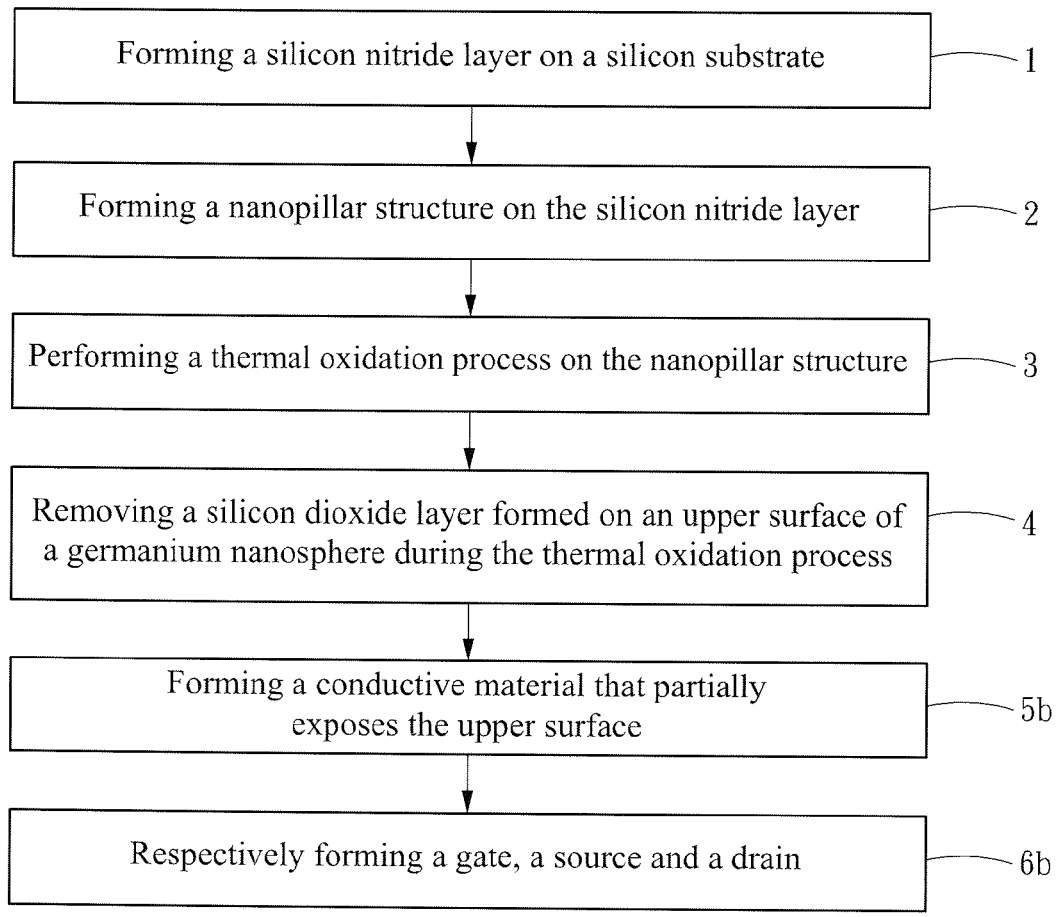
FIG. 5 is a flowchart of steps of a method according to a third embodiment of the present invention.
Figure 6:
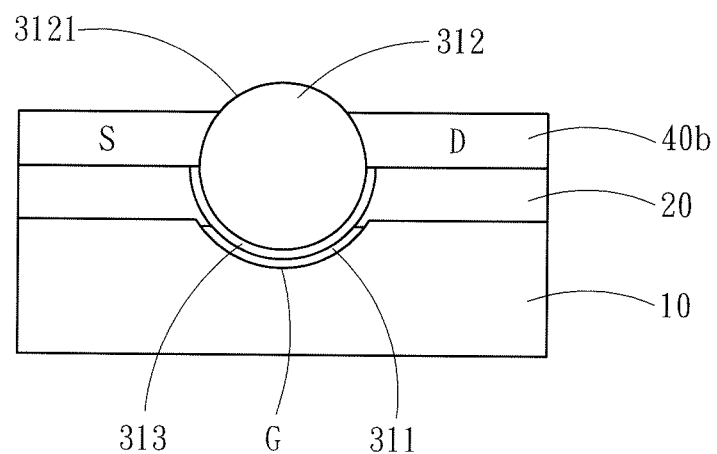
FIG. 6 is a schematic diagram of a MOS core element structure according to the third embodiment of the present invention.

FIG. 5 shows a flowchart of steps of a method according to a third embodiment of the present invention. FIG. 6 shows a schematic diagram of a MOS core element structure according to the third embodiment of the present invention. Referring to FIG. 5 and FIG. 6, compared to the first embodiment, the third embodiment further includes step 5b and step 6b.

In step 5b, a conductive material layer 40b is formed on silicon nitride layer 20 at two sides of the germanium nanosphere 312 while partially exposing the upper surface 3121. As shown in FIG. 6, after the silicon dioxide layer 32b located at the upper surface 3121 is removed, the MOS gate stack structure is treated by an oxide layer removing solution to remove a native oxide layer potentially formed at the upper surface 3121. Immediately, the conductive material layer 40b is formed by sequential deposition, lithography and etching processes on the silicon nitride layer 20 at two sides of the germanium nanosphere 312 with partially exposing the upper surface 3121. For example, the material of the conductive material layer 40b may be polycrystalline silicon, a silicon-metal alloy, or a metal material such as aluminum or aluminum-silicon-copper alloy.

In step 6b, a gate G, a source S and a drain D are formed at the silicon-germanium shell 311 and the conductive material layer 40b at two sides of the germanium nanosphere 312, respectively. By ion implantation, the gate G, the source S and the drain D are defined at the silicon-germanium shell layer 311 and the conductive material layer 40b at two sides of the germanium nanosphere 312, respectively, thereby forming another MOS core element structure based on the i-MOS gate stack structure.

Figure 7:
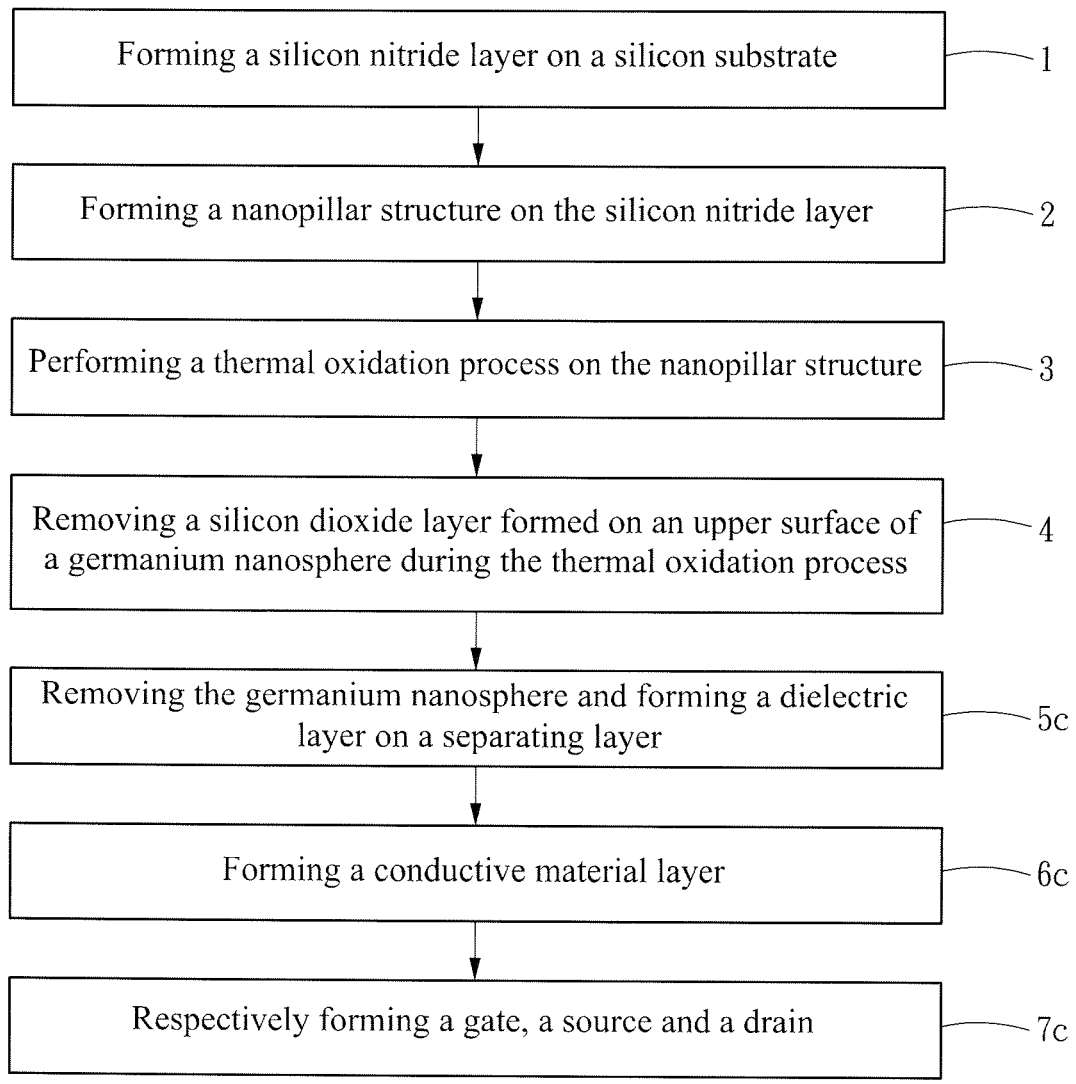
FIG. 7 is a flowchart of steps of a method according to a fourth embodiment of the present invention.
Figure 8:
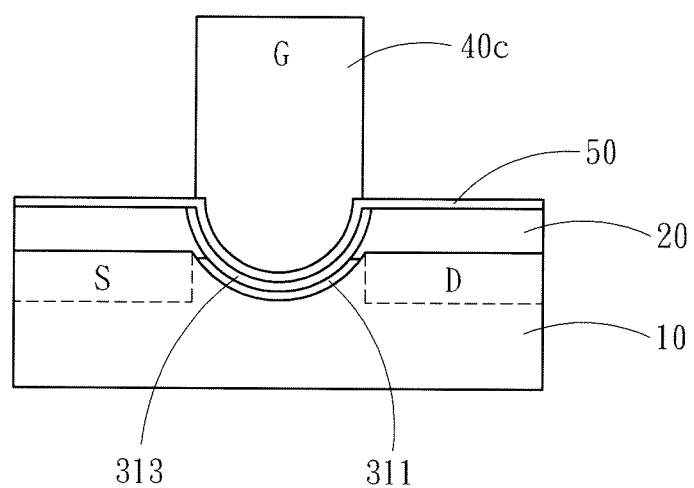
FIG. 8 is a schematic diagram of a MOS core element structure according to the fourth embodiment of the present invention.

FIG. 7 shows a flowchart of steps of a method according to a fourth embodiment of the present invention. FIG. 8 shows a schematic diagram of a MOS core element structure according to the fourth embodiment of the present invention. Compared to the first embodiment, the fourth embodiment further includes step 5c, step 6c and step 7c after step 4.

In step 5c, the germanium nanosphere 312 is removed, and a dielectric layer 50 is formed on the separating layer 313. After the silicon dioxide layer 32b is removed, the germanium nanosphere 312 is also removed, and the dielectric layer 50 is formed on the separating layer 313. The dielectric layer 50 may extend over the silicon nitride layer 20, and is made of a high-dielectric constant material such as hafnium dioxide ($HfO_2$).

In step 6c, a conductive material layer 40c is formed on the dielectric layer 50. For example, the material of the conductive material layer 40c may be polycrystalline silicon, a silicon-metal alloy, or a metal material such as aluminum or aluminum-silicon-copper alloy.

In step 7c, by ion implantation, a gate G, a source S and a drain D are formed at the conductive material layer 40c and in the silicon substrate 10 at two sides of the silicon-germanium shell layer 311, respectively, thereby forming another MOS core element structure based on the i-MOS gate stack structure.

Figure 9:
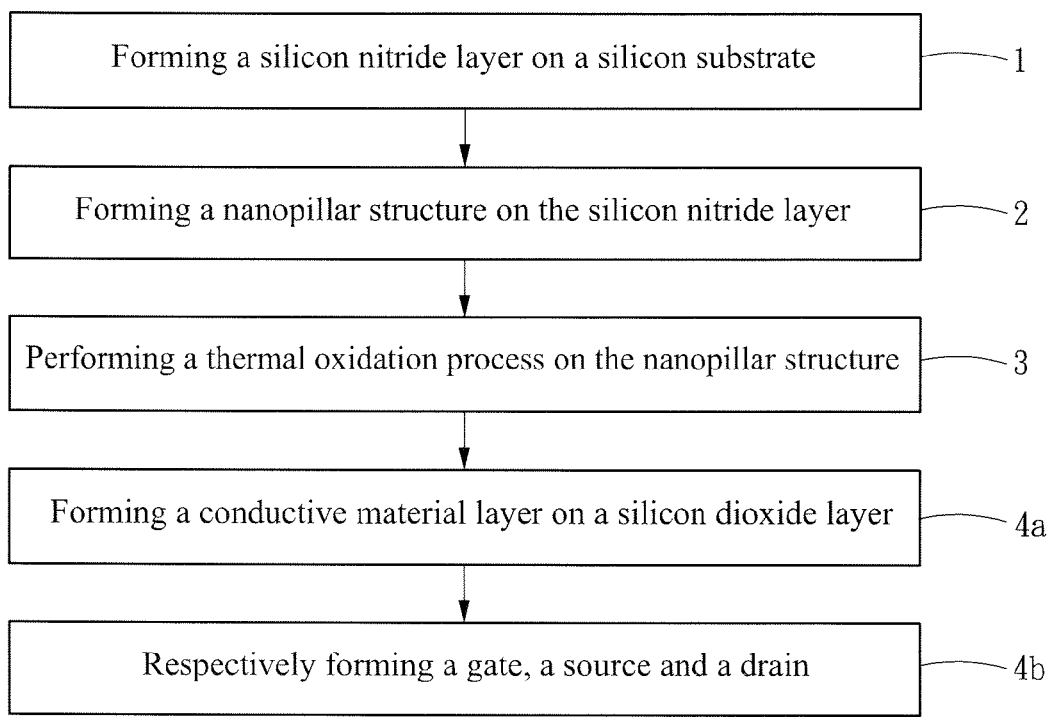
FIG. 9 is a flowchart of steps of a method according to a fifth embodiment of the present invention.
Figure 10:
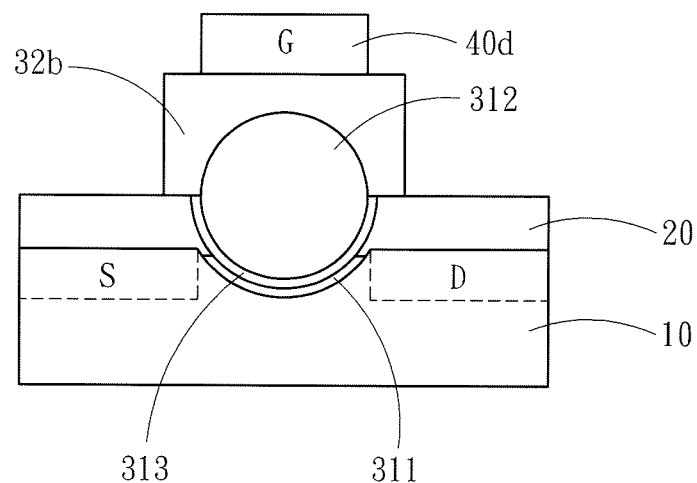
FIG. 10 is a schematic diagram of a MOS core element structure according to the fifth embodiment of the present invention.

FIG. 9 shows a flowchart of steps of a method according to a fifth embodiment of the present invention. FIG. 10 shows a schematic diagram of a floating-gate MOS core element structure. Compared to the first embodiment, the fifth embodiment further includes step 4a and step 4b after step 3.

In step 4a, a conductive material layer 40d is formed on the silicon dioxide layer 32b. After step 3, using sequential deposition, lithography, and etching techniques, the conductive material layer 40d is formed on the silicon dioxide layer 32b. For example, the material of the conductive material layer 40d may be polycrystalline silicon, a silicon-metal alloy, or a metal material such as aluminum or aluminum-silicon-copper alloy.

In step 4b, a gate G, a source S and a drain D are formed by ion implantation at the conductive material layer 40d and in the silicon substrate 10 at two sides of the silicon-germanium shell layer 311, respectively, thereby forming a MOS core element structure based on the i-MOS gate stack structure.

In conclusion, in the present invention, by disposing the silicon-germanium alloy layer to be in contact with the silicon nitride layer over the silicon substrate, and forming the germanium/silicon dioxide/silicon germanium i-MOS gate stack structure with the one-step thermal oxidation process, the present invention at least offers advantages below.

First, the silicon-germanium shell layer and the separating layer made of silicon dioxide with stable structural and electronic properties are formed between the germanium nanosphere and the silicon substrate in a self-organized approach. Such good germanium/silicon dioxide and silicon dioxide/silicon germanium interfaces solve previously-encountered issues of unstable germanium oxides and interface degradation caused by high miscibility. Further, a multi-layer structure and complicated manufacturing processes to suppress the interdiffusion effect between germanium and high-k dielectrics are at the same time avoided.

Second, the separating layer is capable of releasing the stress between the germanium nanosphere and the silicon substrate. Thus, not only is the large strain caused by lattice constant differences during growing the germanium material on the silicon substrate completely eliminated, but also defect issues, such as the formation of misfit dislocations during subsequent high temperature processes are solved.

Further, the i-MOS gate stack structure may be directly utilized as a core structure of a MOSFET. When the i-MOS gate stack structure is manufactured at a surface of a silicon wafer, a micrometer-scale buffer layer for reducing the defect density is not required. Moreover, a complicated and tedious planarization process may also be eliminated in subsequent integration with conventional silicon elements.

What is claimed is:
1. A method for manufacturing an insta-metal-oxide-semiconductor (i-MOS) gate stack structure, comprising the following steps of:
   step 1: forming a silicon nitride layer over a silicon substrate;

step 2: forming a nanopillar structure on the silicon nitride layer, the nanopillar structure comprising a silicon-germanium alloy layer in contact with the silicon nitride layer; and step 3: performing a thermal oxidation process on the nanopillar structure to cause germanium atoms in the silicon-gennanium alloy layer to penetrate underneath the silicon nitride layer to form a silicon-germanium shell layer in contact with the silicon substrate and a germanium nanosphere located over the silicon-germanium shell layer, and to form a separating layer located between the silicon-germanium shell layer and the germanium nanosphere by oxidizing silicon atoms which are released from the silicon nitride layer or from the silicon substrate, so as to form a germanium/silicon dioxide/silicon-germanium i-MOS gate stack structure.

2. The method for manufacturing an i-MOS gate stack structure of claim 1, wherein in step 2 the nanopillar structure further comprises a silicon dioxide layer located at one side of the silicon-germanium alloy layer away from the silicon nitride layer.

3. The method for manufacturing an i-MOS gate stack structure of claim 2, after step 3, further comprising:
step 4: removing the silicon dioxide layer, which is formed at an upper surface of the germanium nanosphere during the thermal oxidation process.

4. The method for manufacturing an i-MOS gate stack structure of claim 3, after step 4, further comprising:
step 5a: forming a conductive material layer at the upper surface; and
step 6a: forming a gate at the conductive material layer, and forming a source and a drain respectively in the silicon substrate at two sides of the silicon-germanium shell layer.

5. The method for manufacturing an i-MOS gate stack structure of claim 3, after step 4, further comprising:
step 5b: forming a conductive material layer on the silicon nitride layer at two sides of the germanium nanosphere with partially exposing the upper surface; and step 6b: forming a gate at the silicon-germanium shell layer, and forming a source and a drain respectively at the conductive material layer at two sides of the germanium nanosphere.

6. The method for manufacturing an i-MOS gate stack structure of claim 3, after step 4, further comprising:
step 5c: removing the germanium nanosphere, and forming a dielectric layer on the separating layer;
step 6c: forming a conductive material layer on the dielectric layer; and
step 7c: forming a gate at the conductive material layer, and forming a source and a drain respectively in the silicon substrate at two sides of the silicon-germanium shell layer.

7. The method for manufacturing an i-MOS gate stack structure of claim 2, after step 3, further comprising:
step 4a: forming a conductive material layer on the silicon dioxide layer; and
step 4b: forming a gate at the conductive material layer, and forming a source and a drain respectively in the silicon substrate at two sides of the silicon-germanium shell layer.

8. The method for manufacturing an i-MOS gate stack structure of claim 1, wherein in step 1 the silicon nitride layer has a thickness between 5 nm to 150 nm.

9. The method for manufacturing an i-MOS gate stack structure of claim 1, wherein in step 2 a Mole fraction of germanium in the silicon-germanium alloy layer is between 0.01 to 0.8.

10. The method for manufacturing an i-MOS gate stack structure of claim 1, wherein in step 2 the silicon-germanium alloy layer has a thickness between 5 nm to 200 nm.

11. The method for manufacturing an i-MOS gate stack structure of claim 1, wherein in step 2 the nanopillar structure is formed by electron beam lithography or photolithography techniques and plasma dry etching.

12. The method for manufacturing an i-MOS gate stack structure of claim 1, wherein in the thermal oxidation process of step 3, the nanopillar structure is placed in an oxygen-containing environment having an adjustable oxidation temperature between 200° C. to 1000° C.

* * * * *